(12) United States Patent
Fox

(10) Patent No.: US 9,388,491 B2
(45) Date of Patent: *Jul. 12, 2016

(54) METHOD FOR DEPOSITION OF CONFORMAL FILMS WITH CATALYSIS ASSISTED LOW TEMPERATURE CVD

(71) Applicant: Novellus Systems, Inc., San Jose, CA (US)

(72) Inventor: Keith Fox, Tigard, OR (US)

(73) Assignee: Novellus Systems, Inc., San Jose, CA (US)

( * ) Notice: Subject to any disclaimer, the term of this patent is extended or adjusted under 35 U.S.C. 154(b) by 315 days.

This patent is subject to a terminal disclaimer.

(21) Appl. No.: 13/946,012

(22) Filed: Jul. 19, 2013

(65) Prior Publication Data

US 2014/0023784 A1   Jan. 23, 2014

Related U.S. Application Data

(60) Provisional application No. 61/674,611, filed on Jul. 23, 2012.

(51) Int. Cl.
| | | |
|---|---|---|
| *C23C 16/34* | (2006.01) | |
| *C23C 16/38* | (2006.01) | |
| *C23C 16/32* | (2006.01) | |
| *C23C 16/455* | (2006.01) | |

(52) U.S. Cl.
CPC ............. *C23C 16/38* (2013.01); *C23C 16/32* (2013.01); *C23C 16/345* (2013.01); *C23C 16/45523* (2013.01)

(58) Field of Classification Search
None
See application file for complete search history.

(56) References Cited

U.S. PATENT DOCUMENTS

| | | | |
|---|---|---|---|
| 4,696,702 A * | 9/1987 | Ellis, Jr. | ............... H01L 31/075 136/258 |
| 5,399,387 A | 3/1995 | Law et al. | |
| 5,589,233 A | 12/1996 | Law et al. | |
| 5,851,602 A | 12/1998 | Law et al. | |
| 6,066,550 A | 5/2000 | Wang | |
| 6,087,278 A | 7/2000 | Kim et al. | |
| 6,207,574 B1 | 3/2001 | Lee | |
| 6,235,650 B1 | 5/2001 | Yao | |
| 6,294,228 B1 * | 9/2001 | Ichikawa | ............. C23C 16/345 427/140 |
| 6,358,573 B1 | 3/2002 | Raoux et al. | |
| 6,407,011 B1 | 6/2002 | Ikeda et al. | |

(Continued)

FOREIGN PATENT DOCUMENTS

| | | |
|---|---|---|
| CN | 101071771 A | 11/2007 |
| CN | 101255552 A | 9/2008 |

(Continued)

OTHER PUBLICATIONS

US Final Office Action dated Feb. 13, 2015 issued in U.S. Appl. No. 13/857,566.

(Continued)

*Primary Examiner* — Mandy Louie

(57) ABSTRACT

A method for depositing a film in a substrate processing system includes arranging a substrate on a pedestal in a processing chamber, heating the substrate to a temperature within a predetermined temperature range, and supplying a gas mixture to the processing chamber for a predetermined period to deposit the film on the substrate, wherein the gas mixture includes a first precursor gas, ammonia gas and diborane gas.

5 Claims, 5 Drawing Sheets

(56) References Cited

U.S. PATENT DOCUMENTS

| | | |
|---|---|---|
| 6,444,277 B1 | 9/2002 | Law et al. |
| 6,811,831 B1 | 11/2004 | Koutny et al. |
| 6,818,533 B2 | 11/2004 | Chen et al. |
| 6,962,859 B2 | 11/2005 | Todd et al. |
| 7,422,776 B2 | 9/2008 | Yim et al. |
| 7,479,443 B2 | 1/2009 | Bauer et al. |
| 7,608,300 B2 | 10/2009 | Bencher et al. |
| 7,635,651 B2 | 12/2009 | Lee et al. |
| 7,858,431 B2 | 12/2010 | Isaka et al. |
| 8,076,250 B1 | 12/2011 | Rajagopalan et al. |
| 8,318,575 B2 | 11/2012 | Lehnert et al. |
| 8,709,551 B2 | 4/2014 | Fox et al. |
| 8,741,394 B2 | 6/2014 | Haverkamp et al. |
| 8,895,415 B1 | 11/2014 | Fox et al. |
| 9,028,924 B2 | 5/2015 | Haverkamp et al. |
| 2001/0007245 A1 | 7/2001 | Weichart |
| 2002/0011656 A1 | 1/2002 | Swanson et al. |
| 2004/0011279 A1 | 1/2004 | Joo |
| 2004/0041239 A1 | 3/2004 | Ruelke et al. |
| 2004/0083973 A1* | 5/2004 | Sakamoto ............ C04B 35/583 118/723 L |
| 2004/0087079 A1 | 5/2004 | Chen et al. |
| 2004/0146661 A1 | 7/2004 | Kapoor et al. |
| 2005/0040456 A1 | 2/2005 | Specht et al. |
| 2005/0045099 A1 | 3/2005 | Bencher et al. |
| 2005/0186686 A1 | 8/2005 | Chen et al. |
| 2005/0196960 A1 | 9/2005 | Koo et al. |
| 2005/0229848 A1 | 10/2005 | Shinriki et al. |
| 2005/0233591 A1 | 10/2005 | Schmitt et al. |
| 2006/0032443 A1* | 2/2006 | Hasebe ................. C23C 16/30 118/715 |
| 2006/0049139 A1 | 3/2006 | Xia et al. |
| 2006/0204673 A1 | 9/2006 | Takayasu et al. |
| 2006/0276011 A1 | 12/2006 | Fogel et al. |
| 2007/0059942 A1 | 3/2007 | Hu et al. |
| 2007/0110918 A1 | 5/2007 | Yuda et al. |
| 2007/0144215 A1 | 6/2007 | Kharas |
| 2007/0215877 A1 | 9/2007 | Kato et al. |
| 2007/0264842 A1 | 11/2007 | Kim |
| 2008/0020591 A1 | 1/2008 | Balseanu et al. |
| 2008/0050883 A1 | 2/2008 | Enicks |
| 2008/0073645 A1 | 3/2008 | Todd et al. |
| 2008/0113521 A1 | 5/2008 | Tanaka et al. |
| 2008/0145536 A1 | 6/2008 | Zhang et al. |
| 2008/0153300 A1 | 6/2008 | Bok |
| 2008/0190886 A1 | 8/2008 | Choi et al. |
| 2008/0202688 A1 | 8/2008 | Wu et al. |
| 2008/0268176 A1 | 10/2008 | Choi et al. |
| 2008/0299747 A1 | 12/2008 | Arai et al. |
| 2009/0022908 A1 | 1/2009 | Yang et al. |
| 2009/0035927 A1 | 2/2009 | Olsen et al. |
| 2009/0095221 A1 | 4/2009 | Tam et al. |
| 2009/0097105 A1 | 4/2009 | Hart et al. |
| 2009/0098741 A1* | 4/2009 | Tanaka .................. C23C 16/34 438/791 |
| 2009/0104790 A1 | 4/2009 | Liang |
| 2009/0159119 A1 | 6/2009 | Basol |
| 2009/0246942 A1 | 10/2009 | Imaeda et al. |
| 2009/0286402 A1 | 11/2009 | Xia et al. |
| 2010/0012030 A1 | 1/2010 | Todd et al. |
| 2010/0102359 A1 | 4/2010 | Khan et al. |
| 2010/0109065 A1 | 5/2010 | Oh et al. |
| 2010/0184302 A1 | 7/2010 | Lee et al. |
| 2010/0210093 A1 | 8/2010 | Kato et al. |
| 2011/0018044 A1 | 1/2011 | Lim et al. |
| 2011/0036168 A1 | 2/2011 | Lin |
| 2011/0143019 A1 | 6/2011 | Mosso et al. |
| 2011/0151142 A1 | 6/2011 | Seamons et al. |
| 2011/0236594 A1 | 9/2011 | Haverkamp et al. |
| 2011/0236600 A1 | 9/2011 | Fox et al. |
| 2012/0142172 A1 | 6/2012 | Fox et al. |
| 2013/0157466 A1 | 6/2013 | Fox et al. |
| 2013/0171834 A1 | 7/2013 | Haverkamp et al. |
| 2013/0267081 A1 | 10/2013 | Fox et al. |
| 2013/0316518 A1 | 11/2013 | Hollister et al. |
| 2014/0357064 A1 | 12/2014 | Fox et al. |
| 2015/0013607 A1 | 1/2015 | Haverkamp et al. |

FOREIGN PATENT DOCUMENTS

| | | |
|---|---|---|
| CN | 101419914 A | 4/2009 |
| DE | 10143235 A1 | 3/2003 |
| EP | 0394054 A1 | 10/1990 |
| JP | 06240459 A | 2/1993 |
| JP | 2000208422 A | 7/2000 |
| WO | WO-2009098548 A1 | 8/2009 |
| WO | WO-2012036808 A2 | 3/2012 |
| WO | WO-2013123143 A1 | 8/2013 |

OTHER PUBLICATIONS

US Notice of Allowance dated Jun. 17, 2015 issued in U.S. Appl. No. 13/857,566.
US Notice of Allowance dated Apr. 20, 2015 issued in U.S. Appl. No. 13/478,999.
Chinese Office Action [official action and description in English] dated Mar. 26, 2015 issued in CN 201180044067.X, 14 pages.
US Notice of Allowance dated Dec. 15, 2014 issued in U.S. Appl. No. 13/671,424.
US Office Action dated Nov. 6, 2014 issued in U.S. Appl. No. 13/478,999.
US Notice of Allowance dated Oct. 16, 2014 issued in U.S. Appl. No. 13/907,742.
Gatz, S., et al., (2008) "Thermal stability of amorphous silicon/silicon nitride stacks for passivating crystalline silicon solar cells," Applied Physics Letters 93:(173502):pp. 1-3.
Keipert-Colberg, Sinje, et al., (Sep. 5-9, 2011) "Investigation of a PECVD silicon oxide/silicon nitride passivation system concerning process influences," Presented at the 26th European PV Solar Energy Conference and Exhibition, Hamburg, Germany, pp. 1-4.
U.S. Appl. No. 14/262,196, filed Apr. 25, 2014, entitled "In-Situ Deposition of Film Stacks," Haverkamp et al.
U.S. Appl. No. 13/907,742, filed May 31,2013, entitled "Tensile Stressed Doped Amorphous Silicon," Fox et al.
US Office Action dated Sep. 11, 2013 issued in U.S. Appl. No. 12/970,846.
US Notice of Allowance dated Jan. 24, 2014 issued in U.S. Appl. No. 12/970,846.
US Office Action dated Feb. 28, 2014 issued in U.S. Appl. No. 13/671,424.
US Notice of Allowance dated Jul. 14, 2014 issued in U.S. Appl. No. 13/671,424.
US Notice of Allowance dated Dec. 18, 2013 issued in U.S. Appl. No. 12/970,853.
US Office Action dated Jan. 30, 2014 issued in U.S. Appl. No. 13/313,422.
US Final Office Action dated May 13, 2014 issued in U.S. Appl. No. 13/313,422.
US Office Action dated Jul. 10, 2014 issued in U.S. Appl. No. 13/857,566.
US Office Action dated Feb. 5, 2014 issued in U.S. Appl. No. 13/478,999.
US Final Office Action dated Jul. 2, 2014 issued in U.S. Appl. No. 13/478,999.
US Notice of Allowance dated Jun. 23, 2014 issued in U.S. Appl. No. 13/907,742.
Singapore Search and Examination Report dated Apr. 18, 2013, issued in SG 201102162-3, 17 pages.
Singapore Search and Examination Report dated Mar. 13, 2014, issued in SG 201301550-8, 16 pages.
PCT International Preliminary Report on Patentability and Written Opinion dated Jun. 3, 2013, issued in PCT/US2013/026069.
Bahari et al., (Jul./Aug. 2006) "Growth of a stacked silicon nitride/silicon oxide dielectric on Si (100)," J. Vac. Sci. Technol. B 24(4): pp. 2119-2123.
Kim et al., (2013) "Double antireflection coating layer with silicon nitride and silicon oxide for crystalline silicon solar cell," J. Electroceram, 30: pp. 41-45.

(56) References Cited

OTHER PUBLICATIONS

Moisan, M. et al., (Oct. 1987) "New surface wave launchers for sustaining plasma columns at submicrowave frequencies (1-300 MHz)" Rev. Sci. Instrum. 58(10): pp. 1895-1900.

Schultz et al., (2005) "Silicon Oxide/Silicon Nitride Stack System for 20% Efficient Silicon Solar Cells," IEEE, pp. 872-876.

Zohni et al., (2007) "Investigating thin film stresses in stacked silicon dioxide/silicon nitride structures and quantifying their effects on frequency response," J. Micromech. Microeng. 17: pp. 1042-1051.

U.S. Appl. No. 13/857,566, filed Apr. 5, 2013, entitled "Post-Deposition Soft Annealing," Fox et al.

U.S. Appl. No. 13/478,999, filed May 23, 2012, entitled "PECVD Deposition of Smooth Silicon Films," Hollister et al.

U.S. Appl. No. 13/667,282, filed Nov. 2, 2012, entitled "Flow Balancing in Gas Distribution Networks," Womack et al.

US Office Action dated Nov. 26, 2012 issued in U.S. Appl. No. 12/970,846.

US Final Office Action dated May 16, 2013 issued in U.S. Appl. No. 12/970,846.

US Office Action dated Apr. 9, 2013 issued in U.S. Appl. No. 12/970,853.

US Final Office Action dated Aug. 9, 2013 issued in U.S. Appl. No. 12/970,853.

Singapore Search Report and Written Opinion dated Nov. 28, 2013, issued in SG201102162-3, 6 pages.

PCT International Preliminary Report on Patentability and Written Opinion dated Apr. 9, 2012, issued in PCT/US2011/047107.

PCT International Search Report and Written Opinion dated Jun. 3, 2013, issued in PCT/US2013/026069.

"Diaphragm Valves," (Oct. 2003) Microelectronics Product Line, Catalog 4505/USA, Parker Hannifin Corporation, pp. 1-49.

Han et al. (Jun. 1994) "Modeling the Properties of PECVD Silicon Dioxide Films Using Optimized Back-Propagation Neural Networks," IEEE Transaction on Components, Packaging, and Manufacturing Technology—Part A, 17 (2): 17 4-182.

Jang, J., et al., "Vertical Cell Array Using TCAT (Terabit Cell Array Transistor) Technology for Ultra High Density NAND Flash Memory," 2009 Symposium on VLSI Technology Digest of Technical Papers, 2009, pp. 192-193.

Kim, J., et al., "Novel Vertical-Stacked-Array-Transistor (VSAT) for Ultra-High-Density and Cost-Effective NAND Flash Memory Devices and SSD (Sold State Drive)," 2009 Symposium on VLSI Technology Digest of Technical Papers, 2009, pp. 186-187.

Kim, W., et al., "Multi-Layered Vertical Gate NAND Flash Overcoming Stacking Limit for Terabit Density Storage," 2009 Symposium on VLSI Technology Digest of Technical Papers, 2009, pp. 188-189.

Ong, Y. et al., Process Analysis and Optimization on PECVD Amorphous Silicon on Glass Substrate, Journal of Physics: Conference Series, vol. 34, 2006, pp. 812-817.

Hoogeland et al., (2009) "Plasma-assisted atomic layer deposition of TiN/A1203 stacks for metal-oxide-semiconductor capacitor applications," Journal of Applied Physics 106, 114107-1-114107-7, 7 pages.

Schmidt et al., (2001) "Surface Passivation of silicon solar cells using plasma enhanced chemical-vapour-deposited SiN films and thin thermal Si02/plasma SiN stacks." Semicond. Sci. Teclmol., 16: pp. 164-170.

Su, Chen-Yi, et al., (2012) "Deposition and characterization of MgO/Si gate stacks grown by molecular beam epitaxy ," Thin Solid Films 520: pp. 4508-4511.

Viana et al. (Jun. 2001) "Analysis of Si02 Thin Film Deposited by PECVD using an Oxygen-TEOS-Argon Mixture," Brazilian Journal of Physics, 31(2): pp. 299-303.

\* cited by examiner

|  |  |  | CSiN1 | CSiN2 | CSiN3 | CSiN4 | CSiN5 |
|---|---|---|---|---|---|---|---|
| SVT | | SiH4 | 80 | 120 | 180 | 120 | 180 |
| | | NH3 | 100 | 100 | 100 | 250 | 250 |
| | | B2H6 | 40 | 40 | 40 | 40 | 40 |
| | | CVD | Yes | Yes | Yes | Yes | Yes |
| FTIR | 895 | Peak | 898 | 894 | 886 | 898 | 895 |
| | | Area | 2.28 | 2.067 | 2.097 | 2.32 | 1.9 |
| | 1290 | Peak | 1294 | 1289 | 1284 | 1286 | 1283 |
| | | Area | 12.7 | 9.6 | 7.03 | 8.5 | 6.1 |
| | 2160 | Peak | 2150 | 2159 | 2156 | 2149 | 2172 |
| | | Area | 0.044 | 0.075 | 0.074 | 0.041 | 0.053 |
| | 2500 | Peak | 2504 | 2507 | 2505 | 2503 | 2497 |
| | | Area | 0.107 | 0.099 | 0.066 | 0.096 | 0.052 |
| | 3400 | Peak | 3408 | 3399 | 3406 | 3415 | 3407 |
| | | Area | 0.076 | 0.06 | 0.044 | 0.066 | 0.042 |
| R.I. | @633 | | 2.070 | 2.131 | 2.214 | 2.020 | 2.070 |
| Stress | Mpa (tensile) | | 89 | 150 | 186 | 173 | 237 |

FIG. 4

METHOD FOR DEPOSITION OF CONFORMAL FILMS WITH CATALYSIS ASSISTED LOW TEMPERATURE CVD

CROSS-REFERENCE TO RELATED APPLICATIONS

This application claims the benefit of U.S. Provisional Application No. 61/674,611, filed on Jul. 23, 2012. The entire disclosure of the application referenced above is incorporated herein by reference

FIELD

The present disclosure relates to chemical vapor deposition, and more specifically to deposition of conformal films using chemical vapor deposition.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Deposition of conformal films at lower temperatures is currently performed using plasma-enhanced chemical vapor deposition (PECVD) using costly, non-generic chemistry that is not widely used in the semiconductor industry. Some deposition techniques used to form conformal films, such as atomic layer deposition (ALD), have complicated sequencing with critical timing steps. As a result of these requirements, yields tend to be lower and cost tends to be higher.

Typical silane ($SiH_4$) based CVD starts to occur in a reactor at ~650° C. pedestal temperature, however the deposited film is typically non-uniform. Decomposition of the $SiH_4$ alone by pyroltic reaction forms amorphous silicon. Adding hydrogen to the reaction results in hydrogenated amorphous silicon, however the pedestal operating temperature still needs to be above ~650° C. for deposition to occur.

SUMMARY

This section provides a general summary of the disclosure, and is not a comprehensive disclosure of its full scope or all of its features.

A substrate processing system for depositing a film includes a processing chamber, a heater, and a controller. The processing chamber includes a pedestal to support a substrate. The heater is configured to heat the substrate to a temperature within a predetermined temperature range. The controller is configured to supply a gas mixture to the processing chamber for a predetermined period, wherein the gas mixture includes a first precursor gas, ammonia gas and diborane gas, purge the processing chamber after the predetermined period, and repeat the supply and purging one or more times to deposit the film.

A method for depositing a film in a substrate processing system includes arranging a substrate on a pedestal in a processing chamber, heating the substrate to a temperature within a predetermined temperature range, and supplying a gas mixture to the processing chamber for a predetermined period to deposit the film on the substrate, wherein the gas mixture includes a first precursor gas, ammonia gas and diborane gas.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein:

FIG. 4 is a table illustrating various examples of flow ratios according to the present disclosure.

DETAILED DESCRIPTION

According to the present disclosure, substrate processing systems and methods are disclosed for forming a conformal film at relatively low temperatures. For example only, the substrate processing systems and methods may employ chemical vapor deposition (CVD) using basic nitride chemistry (for example, silane ($SiH_4$) and ammonia ($NH_3$) (in an inert carrier gas)) with the addition of diborane $B_2H_6$, which acts as a catalyzer.

The substrate processing systems and methods described herein involve decomposition by a catalytic and pyroltic reaction, which enables a lower temperature boundary area that is less than 630° C. For example only, deposition of the conformal film may occur at pedestal temperatures at about 500° C. or greater. In other words, the addition of the catalyzer $B_2H_6$ to the process reaction allows the deposition temperature to be significantly lowered to about ~500° C.

Figure 1:
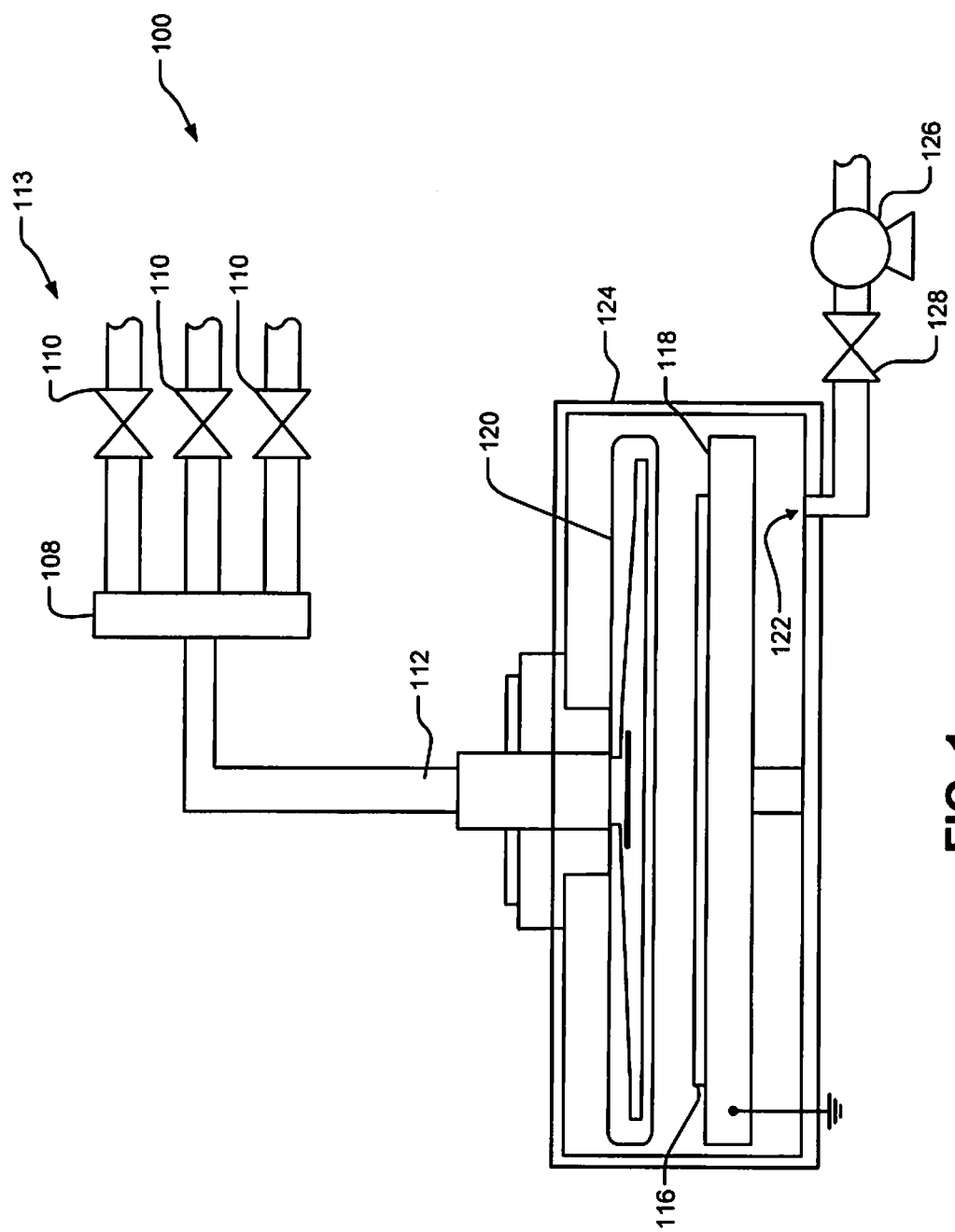
FIGS. 1 and 2 are functional block diagrams of examples of substrate processing systems and methods according to the present disclosure.

Referring now to FIG. 1, an example of a CVD reactor 100 includes a process chamber 124, which encloses other components of the CVD reactor 100. Within the CVD reactor 100, a pedestal 118 supports a substrate 116. A showerhead 120 delivers one or more precursors to the CVD reactor 100. The pedestal 118 typically includes a chuck, a fork, or lift pins to hold and transfer the substrate during deposition or other treatment. The chuck may be an electrostatic chuck, a mechanical chuck or other type of chuck.

The process gases are introduced via inlet 112. Multiple source gas lines 110 are connected to a manifold 108. The gases may be premixed or not. Appropriate valves and mass flow controllers generally identified at 113 are employed to ensure that the correct gases are delivered at predetermined flow rates and mixtures during the deposition and other treatment phases of the process.

Process gases exit the process chamber 124 via an outlet 122. A vacuum pump 126 (for example only, a one or two stage mechanical dry pump and/or a turbo-molecular pump) draws process gases out and maintains a suitable pressure within the reactor using a controlled flow restriction device 128, such as a throttle valve or a pendulum valve.

It is possible to index the wafers after every deposition and/or post-deposition treatment until all the required depositions and treatments are completed, or multiple depositions and treatments can be conducted at a single station before indexing the wafer.

Figure 2:
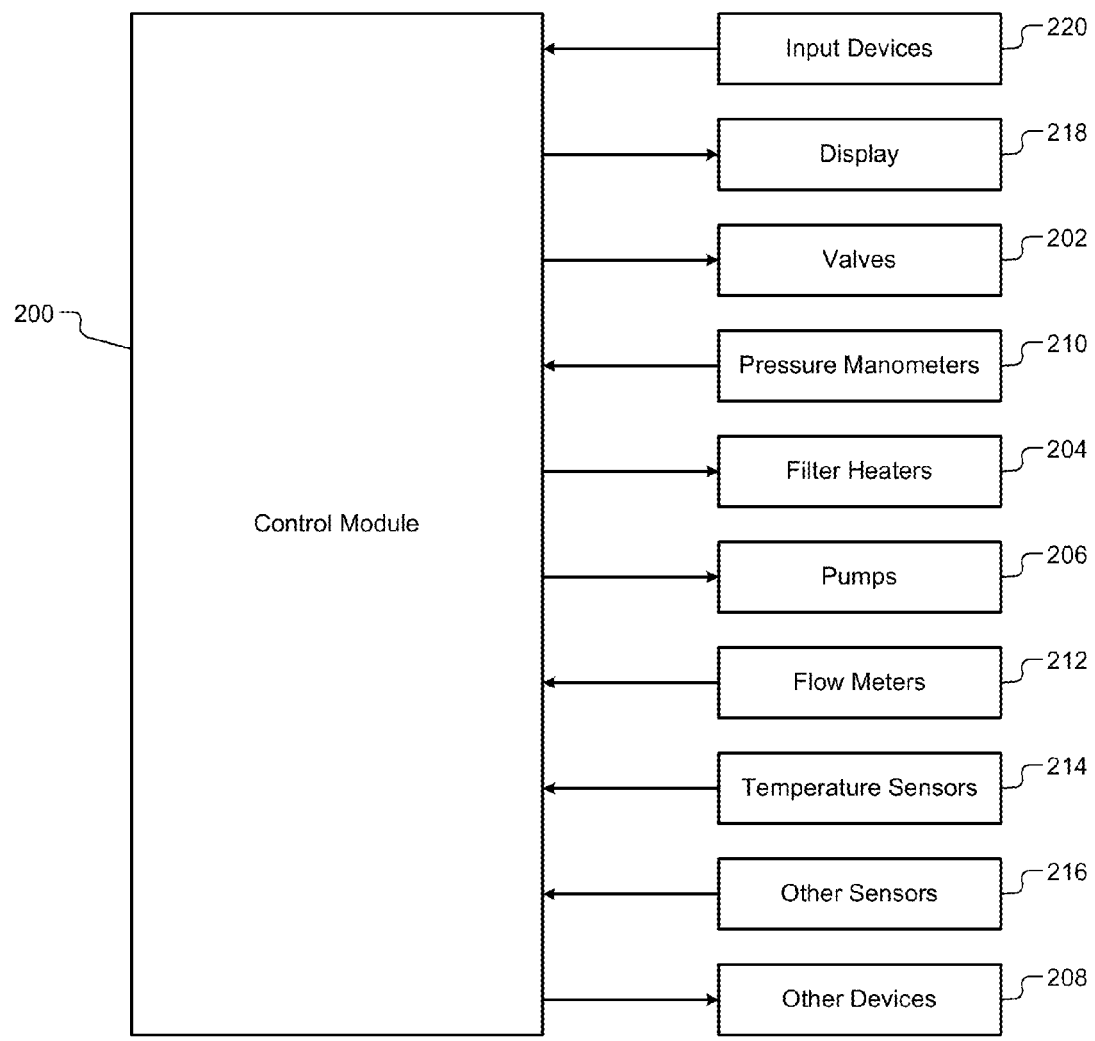

Referring now to FIG. 2, an example of a controller 200 for controlling the system of FIG. 1 is shown. The controller 200 may include a processor, memory and one or more interfaces. The controller 200 may be employed to control devices in the system based in part on sensed values. In addition, the controller 200 may be used to control heating and cooling of the showerhead 120.

For example only, the controller 200 may control one or more of valves 202, filter heaters 204, pumps 206, and other devices 208 based on the sensed values and other control parameters. The controller 200 receives the sensed values from, for example only, pressure manometers 210, flow meters 212, temperature sensors 214, and/or other sensors 216. The controller 200 may also be employed to control process conditions during precursor delivery and deposition of the film. The controller 200 will typically include one or more memory devices and one or more processors.

The controller 200 may control the precursor delivery system and deposition apparatus. The controller 200 executes computer programs including sets of instructions for controlling process timing, delivery system temperature, pressure differentials across the filters, valve positions, mixture of gases, chamber pressure, chamber temperature, wafer temperature, pedestal RF power levels, wafer chuck or pedestal position, and other parameters of a particular process. The controller 200 may also monitor the pressure differential and automatically switch vapor precursor delivery from one or more paths to one or more other paths. Other computer programs stored on memory devices associated with the controller 200 may be employed in some embodiments.

Typically there will be a user interface associated with the controller 200. The user interface may include a display 218 (e.g. a display screen and/or graphical software displays of the apparatus and/or process conditions), and user input devices 220 such as pointing devices, keyboards, touch screens, microphones, etc. The controller parameters relate to process conditions such as, for example, filter pressure differentials, process gas composition and flow rates, temperature, pressure, and chamber wall temperature.

The system software may be designed or configured in many different ways. For example, various chamber component subroutines or control objects may be written to control operation of the chamber components necessary to carry out the deposition processes. Examples of programs or sections of programs for this purpose include substrate positioning code, process gas control code, pressure control code, and heater control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow controllers, pressure sensors such as the pressure manometers 210, and the temperature sensors 214. Appropriately programmed feedback and control algorithms may be used with data from these sensors to maintain desired process conditions. The foregoing describes implementation of embodiments in a single or multi-chamber semiconductor processing tool.

The film growth is smooth and conformal. Using the same process space and temperature, ammonia gas ($NH_3$) can be introduced to the reaction (with or without hydrogen $H_2$) to form SiBN film conditions. The B—N and Si—N peaks (by Fourier transform infrared spectroscopy (FTIR)) can be modulated by a ratio of $SiH_4$ flow to $B_2H_6$ flow. Alternatively, the stress and refractive index (RI) can be modulated by changing the ratio of $SiH_4$ to $NH_3$ flow. The amount of $B_2H_6$ flow needed to act as the chemical catalyzer to start the deposition reaction can be very small.

Figure 3:
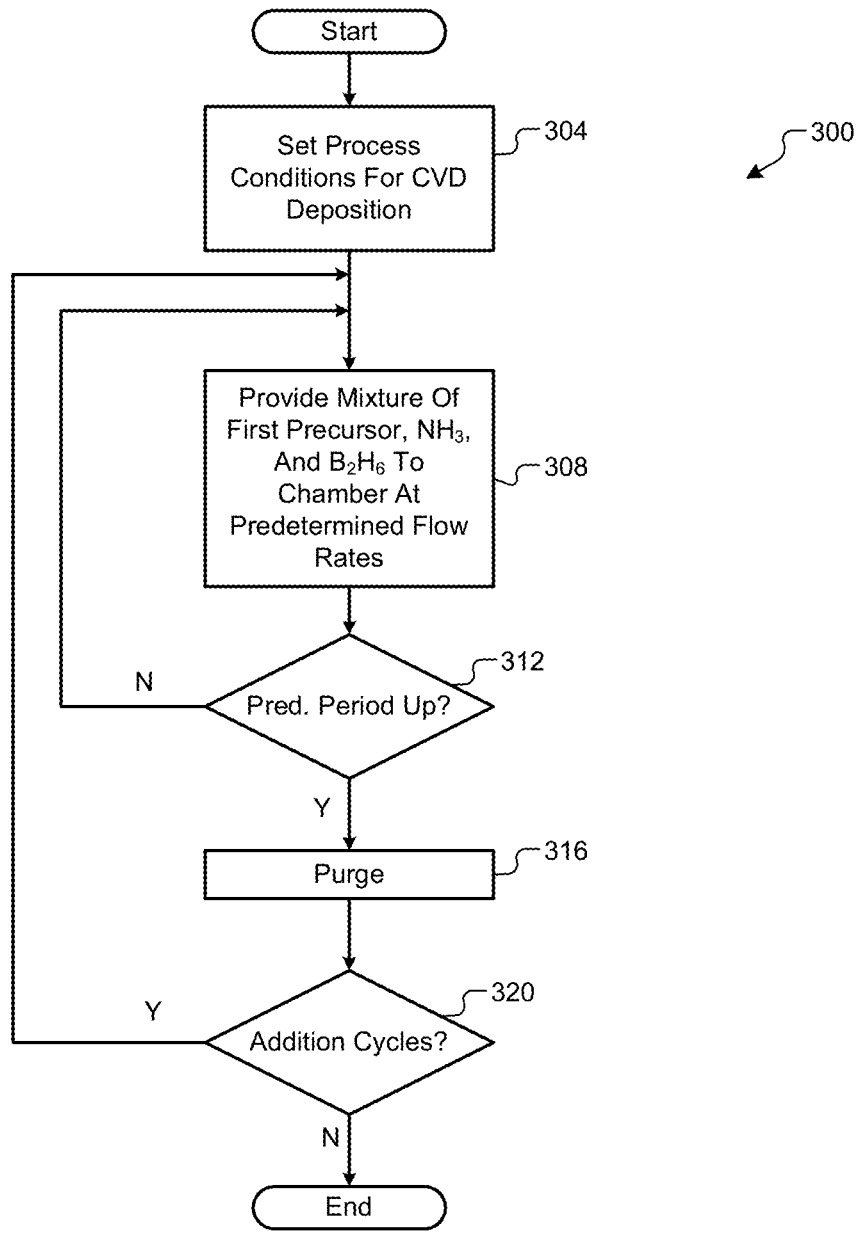
FIG. 3 is a flowchart illustrating an example of method for depositing a conformal film according to the present disclosure.

Referring now to FIG. 3, an example of a method 300 according to the present disclosure is shown. The method 300 includes setting process conditions for CVD deposition at 304. For example, a process temperature and process pressure may be set to suitable values. At 308, flows of a first precursor, $NH_3$ and $B_2H_6$ are provided at predetermined flow rates for a predetermined period as determined at 312. For example only, the first precursor may include $SiH_4$, ethylene ($C_2H_4$), N-Trimethylsilyl Acetamide (TMSA) or tetramethylsilane (4MS). Purge may be performed at 316. The process may be repeated one or more times at 320 for the same predetermined period and/or for variable periods.

For example, conformal films have been deposited with $SiH_4$ to $B_2H_6$ ratios ranging from 1:0.01 to 1:0.025, although other ratios may be used. Using lower $B_2H_6$ flow rates and/or toggling off the $B_2H_6$ flow during the deposition of the film may decrease the amount of boron (as B—N) in the film and increase the Si—N bonding peak to form a full class of films from the boron nitride and true silicon nitride. The films are smooth and conformal.

Multiple different films can be made like SiBN, SiB & SiN with chemistry ratio changes with $SiH_4/NH_3/B_2H_6$. Replacing $SiH_4$ with carbon precursor like ethylene ($C_2H_4$), N-Trimethylsilyl Acetamide (TMSA) or tetramethylsilane (4MS) allows deposition of conformal Boron Carbide films.

The high pedestal temperatures of conventional deposition approaches (about 630° C.) constrain the hardware used since metals such as Al cannot be used at this temperature and chamber heating and outgassing may be problematic. Without adding a chemical to provide a catalytic component to the previously purely pyrolytic reaction, the thermal CVD deposition rate at 500° C. would be near zero.

Figure 5:
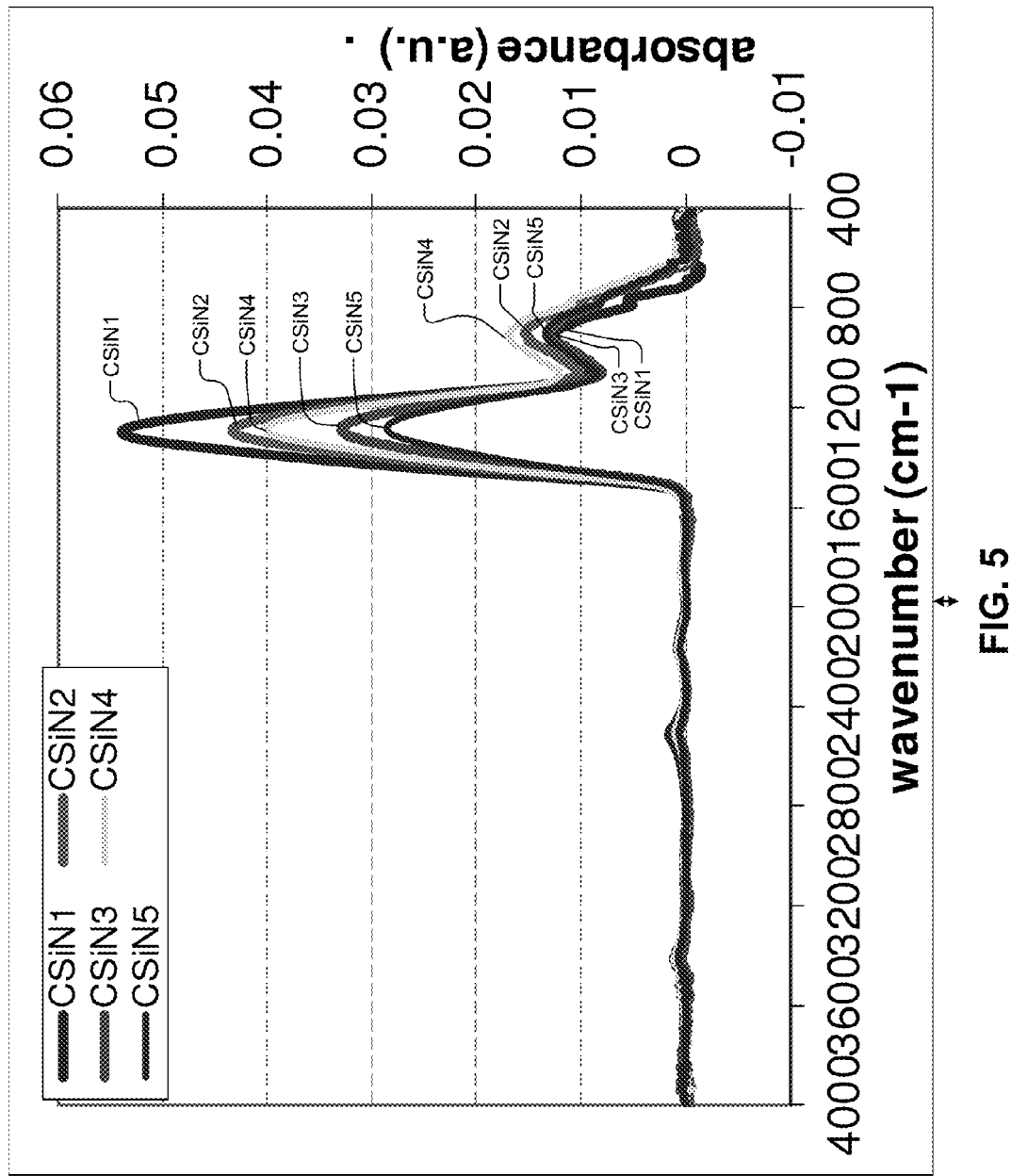
FIG. 5 is a graph illustrating examples of absorbance as a function of wavenumber according to the present disclosure.

Referring now to FIGS. 4 and 5, various examples of the process are shown. In FIG. 4, FTIR analysis, refractive index (RI) and stress are shown for various flow rates of $SiH_4$, $NH_3$ and $B_2H_6$ in sccm. For example only, the process pressure may be approximately 5 Torr, although other process pressure values may be used. In FIG. 5, absorbance is shown as a function of wavenumber for the examples of FIG. 5. These examples employ a ratio of the silane precursor gas to the diborane gas that is between 1:0.22 and 1:0.5

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A method for depositing a conformal film in a substrate processing system, comprising:
   a) arranging a substrate on a pedestal in a processing chamber;
   b) heating the substrate to a temperature within a predetermined temperature range, wherein the predetermined temperature range is between 500° C. and 630° C.; and
   c) supplying a gas mixture to the processing chamber for a predetermined period to deposit the conformal film on the substrate, wherein the gas mixture includes a first precursor gas, ammonia gas and diborane gas, wherein the first precursor gas has a deposition temperature of approximately 650° C., wherein the gas mixture including the diborane gas has a deposition temperature within the predetermined temperature range, and wherein a ratio of the first precursor gas to the diborane gas is between 1:0.01 and 1:0.025.

2. The method of claim 1, further comprising:
   d) purging the gas mixture after the predetermined period; and
   e) repeating a) to d) one or more times.

3. The method of claim 1, wherein the conformal film includes one of a boron nitride film, a silicon nitride film, and a boron carbide film.

4. The method of claim 1, wherein the first precursor gas includes silane.

5. The method of claim 1, further comprising toggling the diborane gas on and off multiple times during the predetermined period.

* * * * *